United States Patent [19]
Koyanagi

[11] 4,015,192
[45] Mar. 29, 1977

[54] VOLTAGE GENERATING SYSTEM

[75] Inventor: Yukio Koyanagi, Katano, Japan

[73] Assignee: Matsushita Electric Industrial Co., Ltd., Osaka, Japan

[22] Filed: July 3, 1975

[21] Appl. No.: 592,992

[30] Foreign Application Priority Data

July 5, 1974 Japan .............................. 49-77550
Nov. 15, 1974 Japan ............................ 49-132144
Nov. 15, 1974 Japan ............................ 49-132145

[52] U.S. Cl. .................................. 323/19; 323/23; 325/464

[51] Int. Cl.² .................................. H04N 5/50

[58] Field of Search .............. 323/16, 17, 19, 22 T, 323/23, 25, 38, 80, DIG. 1; 325/464, 464; 334/15

[56] References Cited
UNITED STATES PATENTS

| | | |
|---|---|---|
| 3,551,777 | 12/1970 | Bingley ..................... 323/DIG. 1 |
| 3,787,784 | 1/1974 | Mangold et al. ................ 334/15 X |
| 3,818,306 | 6/1974 | Marini .......................... 323/DIG. 1 |
| 3,903,490 | 9/1975 | Sakamoto ........................ 334/15 |

*Primary Examiner*—A. D. Pellinen
*Attorney, Agent, or Firm*—Stevens, Davis, Miller & Mosher

[57] ABSTRACT

A voltage generating system comprising generators for producing a plurality of reference voltages, switching devices provided in the reference voltage generators such that any of a given one or given ones of the reference voltages may be selectively taken out, an integrator to smooth a selected reference voltage to obtain an output voltage, a switching pulse generator to produce a switching pulse signal for switching the switching devices and a circuit to vary the duty ratio of the switching pulse signal so as to vary the magnitude of the output voltage. This voltage generating system may be used for generating a channel selection voltage for electronic tuners (varactor tuners), for digital-to-analog converter circuits etc.

11 Claims, 21 Drawing Figures

| CH | | VR | 2 6 7 10 | 12 13 14 16 20 | 22 26 30 | 32 36 40 | 42 46 50 | 52 56 60 | 62 |
|---|---|---|---|---|---|---|---|---|---|
| VHF LOW CH | | 2 | ON | | | | | | |
| | | 3 | $\phi_1 \bar{\phi}_1$ | | | | | | |
| | | 4 | $\phi_2 \bar{\phi}_2$ | | | | | | |
| | | 5 | $\bar{\phi}_1 \phi_1$ | | | | | | |
| | | 6 | ON | | | | | | |
| UHF HIGH CH | | 7 | $\phi_1 \bar{\phi}_1$ | | | | | | |
| | | 8 | $\phi_2 \bar{\phi}_2$ | | | | | | |
| | | 9 | $\bar{\phi}_1 \phi_1$ | | | | | | |
| | | 10 | ON | | | | | | |
| | | 11 | $\phi_2$ | $\bar{\phi}_2$ | | | | | |
| | | 12 | | ON | | | | | |
| | | 13 | | ON | | | | | |
| UHF CH | | 14 | | ON | | | | | |
| | | 15 | | $\phi_2 \bar{\phi}_2$ | | | | | |
| | | 16 | | ON | | | | | |
| | | 17 | | $\phi_1 \bar{\phi}_1$ | | | | | |
| | | 18 | | $\phi_2 \bar{\phi}_2$ | | | | | |
| | | 19 | | $\bar{\phi}_1 \phi_1$ | | | | | |
| | | 20 | | ON | | | | | |
| | | 21 | | $\phi_2$ | $\bar{\phi}_2$ | | | | |
| | | 22 | | | ON | | | | |
| | | 23 | | | $\phi_1 \bar{\phi}_1$ | | | | |
| | | 24 | | | $\phi_2 \bar{\phi}_2$ | | | | |
| | | 25 | | | $\bar{\phi}_1 \phi_1$ | | | | |
| | | 26 | | | ON | | | | |
| | | 27 | | | $\phi_1 \bar{\phi}_1$ | | | | |
| | | 28 | | | $\phi_2 \bar{\phi}_2$ | | | | |
| | | 29 | | | $\bar{\phi}_1 \phi_1$ | | | | |
| | | 30 | | | ON | | | | |
| | | 31 | | | $\phi_2$ | $\bar{\phi}_2$ | | | |
| | | 32 | | | | ON | | | |
| | | 33 | | | | $\phi_1 \bar{\phi}_1$ | | | |
| | | 34 | | | | $\phi_2 \bar{\phi}_2$ | | | |
| | | 35 | | | | $\bar{\phi}_1 \phi_1$ | | | |
| | | 36 | | | | ON | | | |
| | | 37 | | | | $\phi_1 \bar{\phi}_1$ | | | |
| | | 38 | | | | $\phi_2 \bar{\phi}_2$ | | | |
| | | 39 | | | | $\bar{\phi}_1 \phi_1$ | | | |
| | | 40 | | | | ON | | | |
| | | 41 | | | | $\phi_2$ | $\bar{\phi}_2$ | | |
| | | 42 | | | | | ON | | |

FIG. 7b

| CH | VR | 40 | 42 46 50 | 52 56 60 | 62 66 70 | 72 76 80 | 82 83 |
|---|---|---|---|---|---|---|---|
| U H F | 43 | | $\phi_1\ \bar{\phi_1}$ | | | | |
| | 44 | | $\phi_2\ \bar{\phi_2}$ | | | | |
| | 45 | | $\bar{\phi_1}\ \phi_1$ | | | | |
| | 46 | | ON | | | | |
| | 47 | | $\phi_1\ \bar{\phi_1}$ | | | | |
| | 48 | | $\phi_2\ \bar{\phi_2}$ | | | | |
| | 49 | | $\bar{\phi_1}\ \phi_1$ | | | | |
| | 50 | | ON | | | | |
| | 51 | | $\phi_2$ | $\bar{\phi_2}$ | | | |
| | 52 | | | ON | | | |
| | 53 | | | $\phi_1\ \bar{\phi_1}$ | | | |
| | 54 | | | $\phi_2\ \bar{\phi_2}$ | | | |
| | 55 | | | $\bar{\phi_1}\ \phi_1$ | | | |
| | 56 | | | ON | | | |
| | 57 | | | $\phi_1\ \bar{\phi_1}$ | | | |
| | 58 | | | $\phi_2\ \bar{\phi_2}$ | | | |
| | 59 | | | $\bar{\phi_1}\ \phi_1$ | | | |
| | 60 | | | ON | | | |
| | 61 | | | $\phi_2$ | $\bar{\phi_2}$ | | |
| | 62 | | | | ON | | |
| | 63 | | | | $\phi_1\ \bar{\phi_1}$ | | |
| | 64 | | | | $\phi_2\ \bar{\phi_2}$ | | |
| | 65 | | | | $\bar{\phi_1}\ \phi_1$ | | |
| | 66 | | | | ON | | |
| | 67 | | | | $\phi_1\ \bar{\phi_1}$ | | |
| | 68 | | | | $\phi_2\ \bar{\phi_2}$ | | |
| | 69 | | | | $\bar{\phi_1}\ \phi_1$ | | |
| | 70 | | | | ON | | |
| | 71 | | | | $\phi_2$ | $\bar{\phi_2}$ | |
| | 72 | | | | | ON | |
| | 73 | | | | | $\phi_1\ \bar{\phi_1}$ | |
| | 74 | | | | | $\phi_2\ \bar{\phi_2}$ | |
| | 75 | | | | | $\bar{\phi_1}\ \phi_1$ | |
| | 76 | | | | | ON | |
| | 77 | | | | | $\phi_1\ \bar{\phi_1}$ | |
| | 78 | | | | | $\phi_2\ \bar{\phi_2}$ | |
| | 79 | | | | | $\bar{\phi_1}\ \phi_1$ | |
| | 80 | | | | | ON | |
| | 81 | | | | | $\phi_2$ | $\bar{\phi_2}$ |
| | 82 | | | | | | ON |
| | 83 | | | | | | ON |

| VR\CH | a | b | c | d | e | f | g |
|---|---|---|---|---|---|---|---|
| 30 | ON | | | | | | |
| 31 | $\phi_1$ | $\bar{\phi}_1$ | | | | | |
| 32 | $\phi_2$ | $\bar{\phi}_2$ | | | | | |
| 33 | $\bar{\phi}_2$ | $\phi_2$ | | | | | |
| 34 | $\bar{\phi}_1$ | $\phi_1$ | | | | | |
| 35 | | ON | | | | | |
| 36 | | $\phi_1$ | $\bar{\phi}_1$ | | | | |
| 37 | | $\phi_2$ | $\bar{\phi}_2$ | | | | |
| 38 | | $\bar{\phi}_2$ | $\phi_2$ | | | | |
| 39 | | $\bar{\phi}_1$ | $\phi_1$ | | | | |
| 40 | | | ON | | | | |
| 41 | | | $\phi_1$ | $\bar{\phi}_1$ | | | |
| 42 | | | $\phi_2$ | $\bar{\phi}_2$ | | | |
| 43 | | | $\bar{\phi}_2$ | $\phi_2$ | | | |
| 44 | | | $\bar{\phi}_1$ | $\phi_1$ | | | |
| 45 | | | | ON | | | |
| 46 | | | | $\phi_1$ | $\bar{\phi}_1$ | | |
| 47 | | | | $\phi_2$ | $\bar{\phi}_2$ | | |
| 48 | | | | $\bar{\phi}_2$ | $\phi_2$ | | |
| 49 | | | | $\bar{\phi}_1$ | $\phi_1$ | | |
| 50 | | | | | ON | | |
| 51 | | | | | $\phi_1$ | $\bar{\phi}_1$ | |
| 52 | | | | | $\phi_2$ | $\bar{\phi}_2$ | |
| 53 | | | | | $\bar{\phi}_2$ | $\phi_2$ | |
| 54 | | | | | $\bar{\phi}_1$ | $\phi_1$ | |
| 55 | | | | | | ON | |
| 56 | | | | | | $\phi_1$ | $\bar{\phi}_1$ |
| 57 | | | | | | $\phi_2$ | $\bar{\phi}_2$ |
| 58 | | | | | | $\bar{\phi}_2$ | $\phi_2$ |
| 59 | | | | | | $\bar{\phi}_1$ | $\phi_1$ |
| 60 | | | | | | | ON |

VOLTAGE GENERATING SYSTEM

This invention relates to voltage generating systems used for electronic tuners and digital-to-analog converter circuits etc., and it provides a system which permits a number of different voltages to be obtained with a simple construction.

In the commonly termed electronic tuner using a voltage variable capacitance diode as a tuning element, a number of channels are tuned in by switching the magnitude of the channel selection voltage applied to the variable capacitance diode,; therefore, it is necessary to be able to steadily obtain a number of voltages of different values. Heretofore, use has been made of a number of variable resistors for generating the different voltages. Therefore, the construction of the device has been mechanical and complicated, and this trend has been the more notable as the number of different voltages to generate increases. Besides, the stability of the voltage generated has depended on the stability of the source voltage and resistors.

Various digital and analog converters for converting a digital input to an analog output are used. Conventionally a digital-to-analog converter has been used in which a row of resistors, which are switched by switching means driven by individual bits of a digital signal input is used. In these prior-art digital-to-analog converters, the construction becomes complicated when the number of different available voltages is increased. Also, the stability of the output voltage has depended on the stability of the resistors. Further, since accurate fine adjustment of the resistances of the number of resistors is needed, incorporation of this structure into monalithic integrated circuits has been difficult. A further inconvenience is due to the fact that the step ratio of the analog output voltage has been restricted to a constant ratio.

The above various inconveniences have also been encountered with various other voltage generating means.

An object of the invention, accordingly, is to provide a volage generating system, which can be extensively used for electronic tuners (varactor tuners), digital-to-analog converters and other circuits, permits a number of different voltages to be obtained with a comparatively simple construction switches these voltages with simple means, and is further capable of incorporation into integrated circuits.

The above and other objects, features and advantages of the invention will become more apparent from the following description when the same is read with reference to the accompanying drawings, in which.

Figure 1:
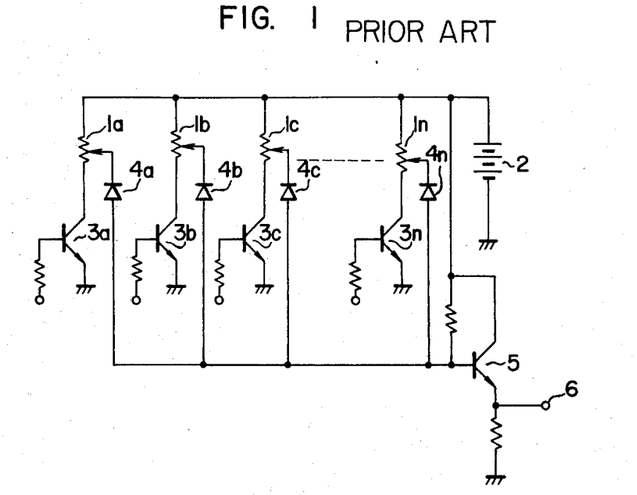
FIG. 1 is a circuit diagram showing a prior-art voltage generating system.

A prior-art voltage generating system will first be described with reference to FIG. 1. In the figure, $1a$, $1b$, ..., $1n$ designate voltage presetting variable resistors which are commonly connected at their one end to a power supply 2. These variable resistors $1a$, $1b$, ..., $1n$ are on-off switched by respective switching transistors $3a$, $3b$, ..., $3n$ connected to their other ends. When one of the transistors $3a$, $3b$, ..., $3n$, for instance transistor $3b$, is rendered "on" and other transistors are all "off", only a diode $4b$ connected to the tap of the variable resistor $1b$ connected to the transistor $3b$ is made conductive since the tap voltage on the other variable resistors is constituted by the source voltage. Thus, the tap voltage on the variable resistor $1b$ alone is taken out as an output voltage from an output terminal 6 through a transistor 5 connected as an emitter follow.

With this arrangement, the number of different output voltages that can be obtained from the output terminal 6 is identical with the number of the voltage presetting variable resistors $1a$, $1b$ ..., $1n$. Therefore, to increase the number of available voltages with different values a corresponding increased number of variable resistors is required and more space becomes necessary. Also, this increases the rate of occurrence of failure due to contact failure etc. of the variable resistors. In addition, the preset voltages are subject to fluctuations due to such causes as temperature and relative humidity changes. Further, complicated construction is required for the circuit for selecting a desired one of these many variable resistors.

A first embodiment of the invention will now be described with reference to FIGS. 2 to 10.

Figure 2:
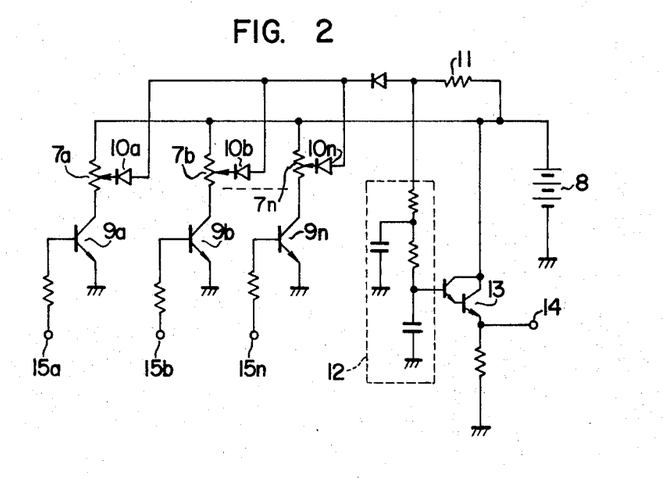
FIG. 2 is a circuit diagram showing an embodiment of the voltage generating system according to the invention.

FIG. 2 shows an example of the voltage producing circuit using a plurality of variable resistors. Here, a plurality of variable resistors for voltage presetting, $7a$, $7b$, ..., $7n$, as means for producing a plurality of reference voltages are commonly connected at their one end to a power supply 8. These variable resistors are on-off switched by respective switching transistors $9a$, $9b$, ..., $9n$, which are connected to the other ends of the variable resistors and serve as means to select a desired one or more of the plurality of reference voltages. The taps of the variable resistors $7a$, $7b$, ..., $7n$ are connected through respective diodes $10a$, $10b$, ..., $10n$ to a common juncture connected through a resistor 11 to the power supply 8. Thus, when any of the transistors $9a$, $9b$, ..., $9n$ is rendered on, for instance transistor $9b$, it is possible to take out only the tap voltage on the associated variable resistor 7b. This tapped voltage is smoothed by a low-pass filter 12 consisting of an integrating circuit serving as a smoothing circuit and then coupled to a transistor 13 for impedance conversion to take out from an output terminal 14 the tapped voltage as an output voltage.

The transistors $9a, 9b, \ldots, 9n$ here are switched with a special interval to vary the output voltage.

More particularly, the waveform of a switching pulse signal coupled to the bases of the transistors from respective terminals $15a, 15b, \ldots, 15n$ is varied to vary the magnitude of the output voltage. This will now be discussed in detail.

Figure 3:
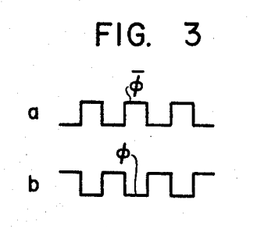
FIGS. 3 to 6 are waveform charts for illustrating the operating mode of the same system.

Table 1 below shows a relation between an input switching pulse signal coupled to the terminals 15a and 15b and the output voltage when the duty ratio of the waveform of the input switching pulse signal is ½ as shown in a and b of FIG. 3.

Table 1

| Input | | Output |
|---|---|---|
| 15a | 15b | |
| 1 | 0 | $V_A$ |
| $\phi$ | $\bar{\phi}$ | $\dfrac{V_A + V_B}{2}$ |
| 0 | 1 | $V_B$ |

Table 1 shows that not only voltages $V_A$ and $V_B$ which are reference voltages specified by the respective variable resistors 7a and 7b, but also a voltage of a level in the middle of $V_A$ and $V_B$ can be obtained as the output voltage.

Figure 4:
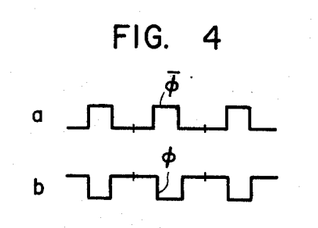

Table 2 below shows a case with input switching pulse signals with respective duty ratios of ⅓ and ⅔ as shown in a and b of FIG. 4.

Table 2

| Input | | Output |
|---|---|---|
| 15a | 15b | |
| 1 | 0 | $V_A$ |
| $\phi$ | $\bar{\phi}$ | $V_A + \dfrac{1}{3}(V_B - V_A)$ |
| $\bar{\phi}$ | $\phi$ | $V_A + \dfrac{2}{3}(V_B - V_A)$ |
| 0 | 1 | $V_B$ |

In this case, voltages at levels trisecting the interval between $V_A$ and $V_B$ and be obtained as the output voltage in addition to $V_A$ and $V_B$.

Figure 5:
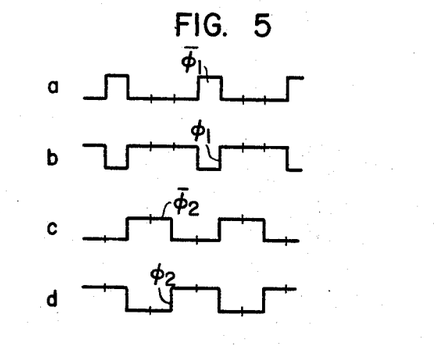
Figure 6:
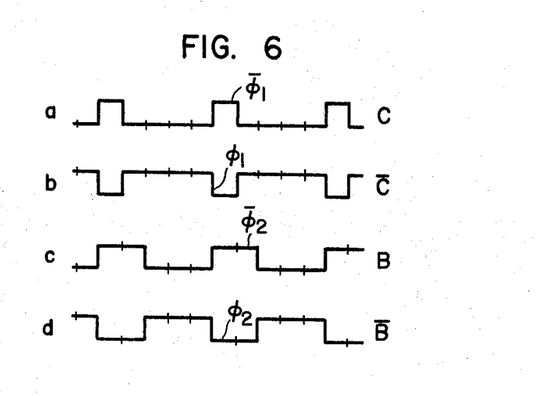

Likewise, Tables 3 and 4 below respectively show a case with input switching pulse signals with respective duty ratios of ¼, ½ and ¾ as shown in a to d of FIG. 5 and a case with input switching signals with respective duty ratious of 1/5, 2/5, 3/5 and 4/5 as shown in a to d of FIG. 6.

Table 3

| Input | | Output |
|---|---|---|
| 15a | 15b | |
| 1 | 0 | $V_A$ |
| $\phi_1$ | $\bar{\phi}_1$ | $V_A + \dfrac{1}{4}(V_B - V_A)$ |
| $\phi_2$ | $\bar{\phi}_2$ | $V_A + \dfrac{1}{2}(V_B - V_A)$ |

Table 3-continued

| Input | | Output |
|---|---|---|
| $\bar{\phi}_1$ | $\phi_1$ | $V_A + \dfrac{3}{4}(V_B - V_A)$ |
| 0 | 1 | $V_B$ |

Table 4

| Input | | Output |
|---|---|---|
| 15a | 15b | |
| 1 | 0 | $V_A$ |
| $\phi_1$ | $\bar{\phi}_1$ | $V_A + \dfrac{1}{5}(V_B - V_A)$ |
| $\phi_2$ | $\bar{\phi}_2$ | $V_A + \dfrac{2}{5}(V_B - V_A)$ |
| $\bar{\phi}_2$ | $\phi_2$ | $V_A + \dfrac{3}{5}(V_B - V_A)$ |
| $\bar{\phi}_1$ | $\phi_1$ | $V_A + \dfrac{4}{5}(V_B - V_A)$ |
| 0 | 1 | $V_B$ |

In these cases, voltages of levels quatrisecting and quinsecting the interval between $V_A$ and $V_B$ can be obtained as the output voltage in addition to $V_A$ and $V_B$.

In this way, voltages of levels intermediate two fixed voltages can be obtained by varying the duty ratio of two opposite-phase input switching pulse signals. Further, it is of course possible to use three reference voltages with three-phase pulse signals or four reference voltages with four-phase pulse signals.

Figure 7A:
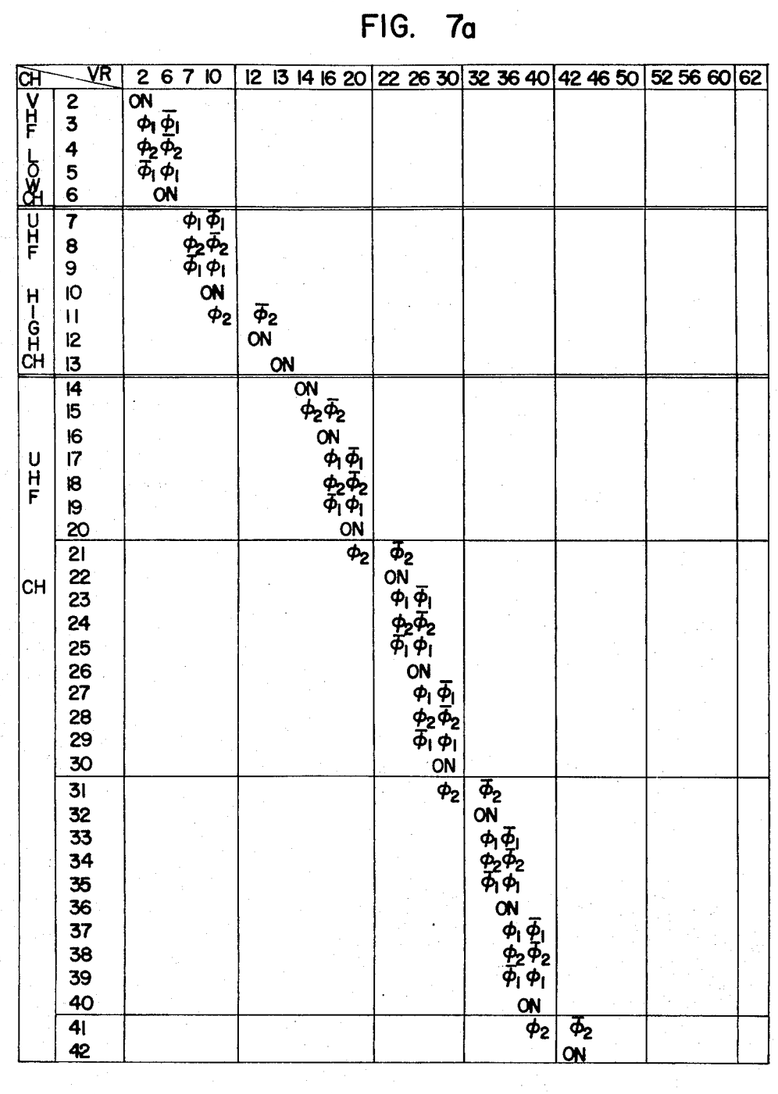
FIGS. 7a and 7b show a chart illustrating the operating mode of the same system.
Figure 7B:
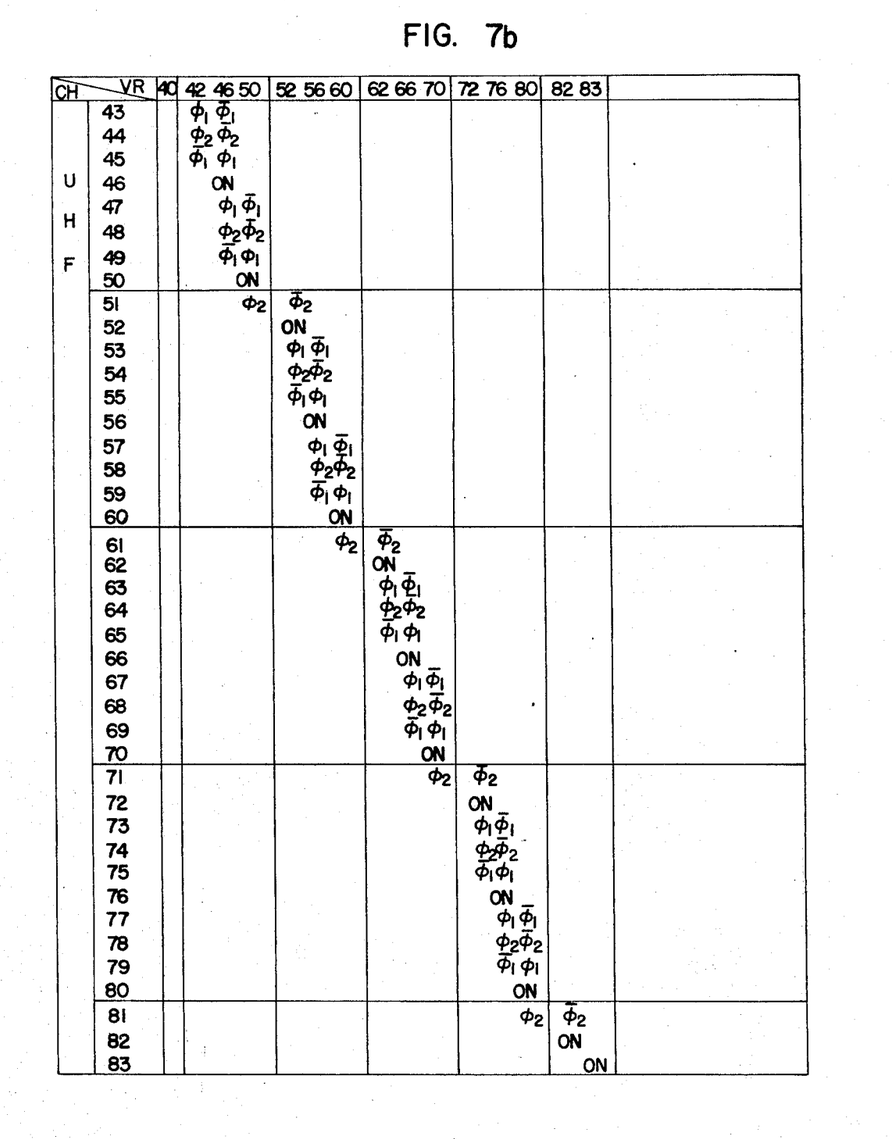

FIGS. 7a and 7b show a chart of an example of the operating mode of producing station selection preset voltages on the basis of the principles underlying the invention applied to an electronic tuner for U.S.A. standard television receivers. Here, a total of 82 channels are covered, with channels No. 2 to No. 6 being LOW VHF channels, channels No. 7 to No. 13 being HIGH VHF channels and channels No. 14 to No. 83 being UHF channels. The numbers indicated at the top row of the chart are ones of preset volume for generating 29 reference voltages. This chart indicates that to the transistors, connected respectively to the corresponding preset variable resistors, are applied the reference voltages, each capable of selecting a channel whose number is indicated by one of the transistors.

Figure 8:
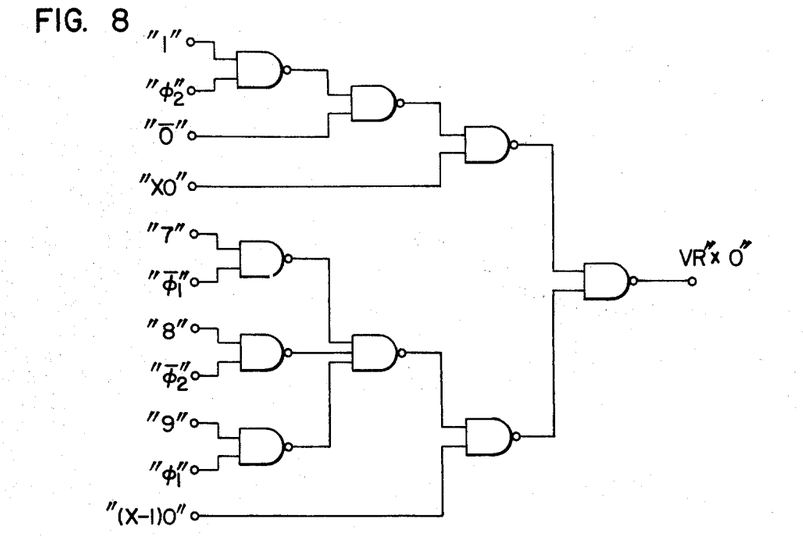
FIGS. 8 to 10 are circuit diagrams showing respective logic circuits required for producing switching pulse signals for controlling the same system.
Figure 9:
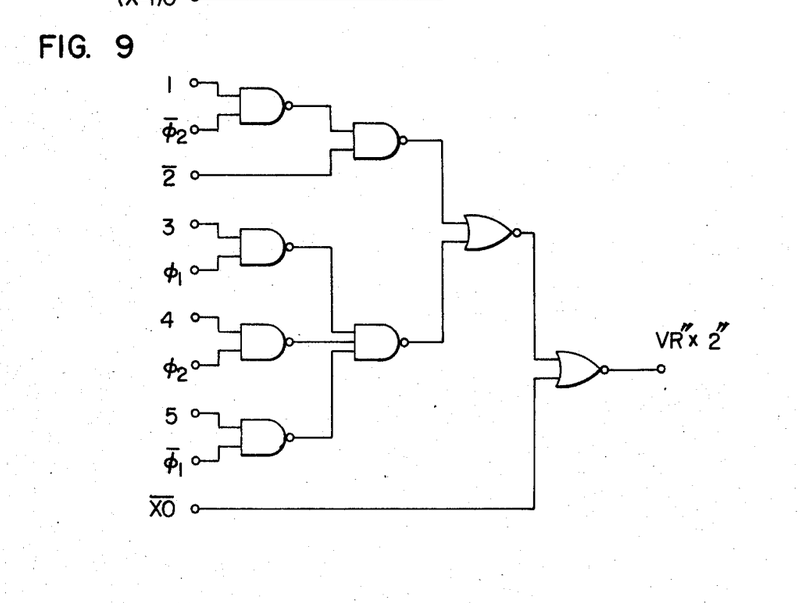
Figure 10:
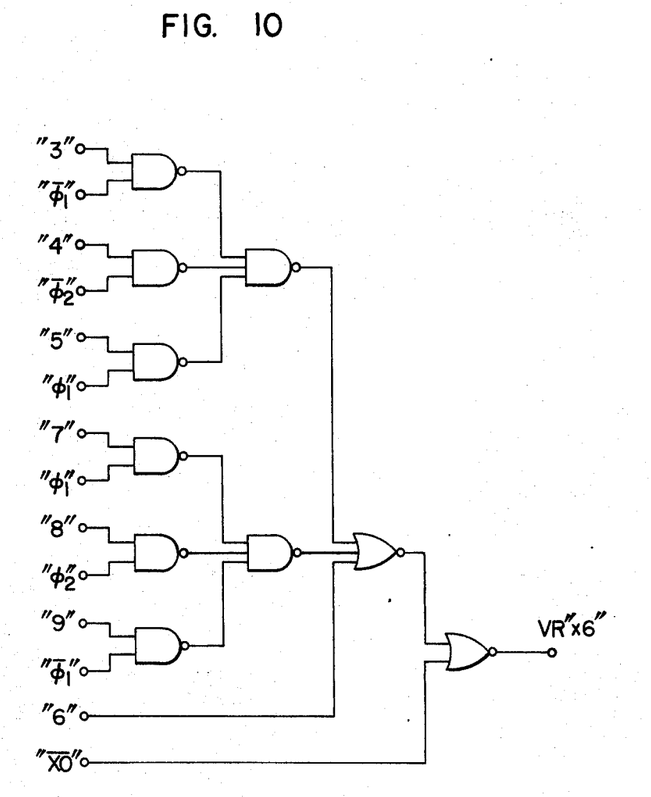

The logic means for coupling a switching pulse signal to some of these variable resistors, namely VR.XO. (with the subscript representing the channel number and X being 2, 3, 4, . . . ) is, in general, as shown in FIG. 8, although there is some difference at each boundary between bands, as all the channels are roughly divided into three bands. For example, for VR$_{30}$, with X = 3, the output at the output terminal of the reference voltage from VR$_{XO}$ is $\bar{\phi}_1$ for channel No. 27, $\bar{\phi}_2$ for channel No. 28, $\phi_1$ for channel No. 29, 1 for channel No. 30 and $\phi_2$ for channel No. 31 and is 0 for the other channels. This conforms to the chart of FIGS. 7a and 7b, and in general this is so except at the boundaries of the three bands, namely HIGH VHF, LOW VHF and UHF bands, into which all the channels fall. FIG. 9 shows a logic means for applying a switching pulse signal to the switching transistor connected to the variable resistor VR$_{X2}$ for the channel X2 (with X being 2, 3, 4, . . . ), and FIG. 10 shows a logic means for coupling a switching pulse signal to the switching transistor connected to the variable resistor VR$_{X6}$ (with X being 2, 3, 4, ...). In FIGS. 8 to 10, symbols 1, 2, 3, ... at respective input terminals designate signals representing the first digit of the channel number; for example, the signal 1 is 1 (i.e., at high level) if the first digit of the channel number of the channel to be tuned in is 1 and 0 (i.e., at low level) in the other cases. On the other hand, symbols $\bar{1}, \bar{2}, \bar{3}$ designate signals which are 0 (low level) if a channel of a channel number of the corresponding first digit is to tuned in and 1 in the other cases. The waveforms of the signals $\phi_1, \bar{\phi}_1, \phi_2$ and $\bar{\phi}_2$ are as shown in FIG. 5.

Figure 11:
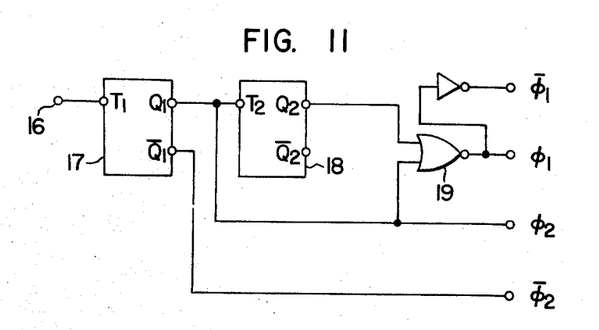
FIG. 11 is a circuit diagram showing a means for producing a clock pulse signal necessary for the operation of the same system.
Figure 12:
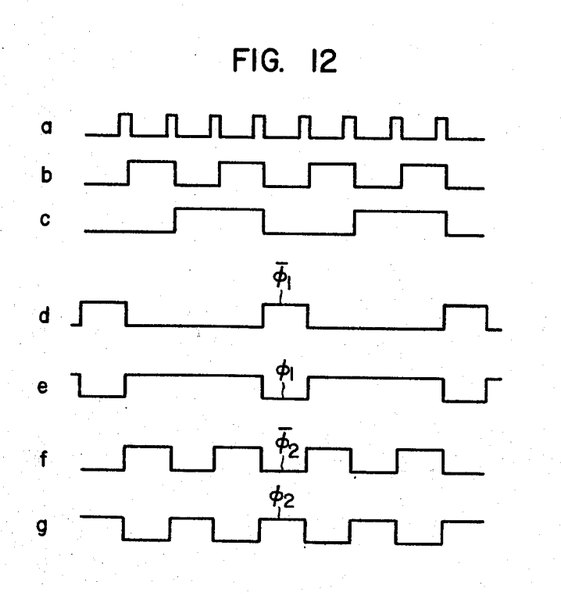
FIG. 12 is a waveform chart to illustrate the operation of the circuit of FIG. 11.

The signals $\phi_1, \bar{\phi}_1, \phi_2$ and $\bar{\phi}_2$ can be produced in a simple way, for instance by coupling a suitable clock pulse input to an input terminal 16 of the circuit shown in FIG. 11, which circuit is a combination of a divider circuit in which T-type flip-flops 17 and 18 are connected in cascade and a gate 19. Their waveforms are shown in FIG. 12. The duty ratio of the waveforms thus formed will not change with voltage or frequency, therefore, the afore-mentioned voltage division ratio is very steady. The waveform of the input to the terminal 16 is shown at $a$ in FIG. 12, and the waveforms of the outputs Q$_1$ and Q$_2$ of the flip-flops 17 and 18 are shown at $b$ and $c$ respectively.

By adopting these logic systems the number of reference voltages can be reduced toward the number of different voltage outputs that are obtainable; in the example of the afore-mentioned U.S.A. channel 82 kinds of different channel selection voltages are obtainable from 29 different reference voltages and two switching pulse signals with a very simple circuit construction. Also, if the voltage output from the variable resistor 7b in the circuit of FIG. 2 is always greater than that from the variable resistor 7a, it is possible to hold the transistor for the variable resistor of the greater voltage value in the on state and switch the transistor for the variable resistor of the smaller voltage value.

As mentioned above, the voltage generating system according to the invention permits a number of different voltages to be obtained with less reference voltages, so that it is very convenient for use in electronic tuners for television receivers.

Figure 13:
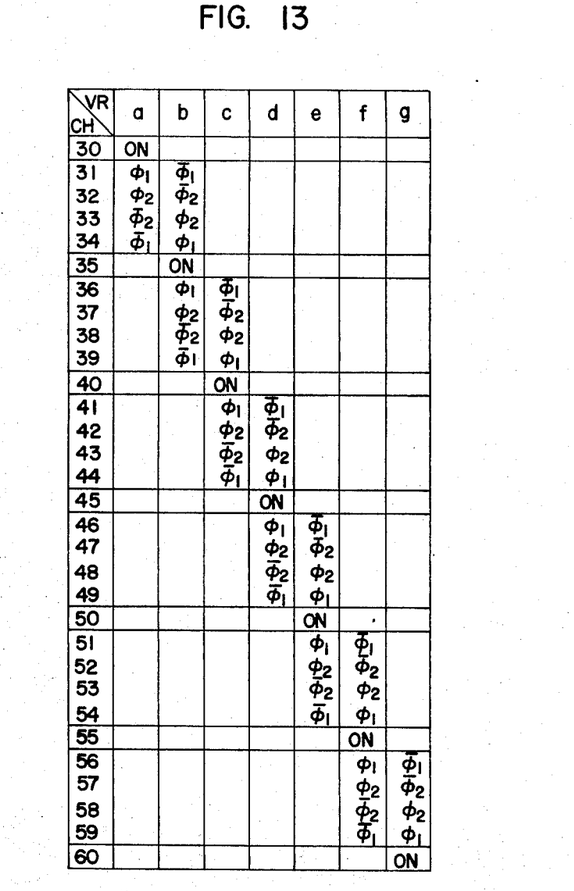
FIG. 13 is a chart illustrating the operating mode of another embodiment of the voltage generating system according to the invention.
Figure 14:
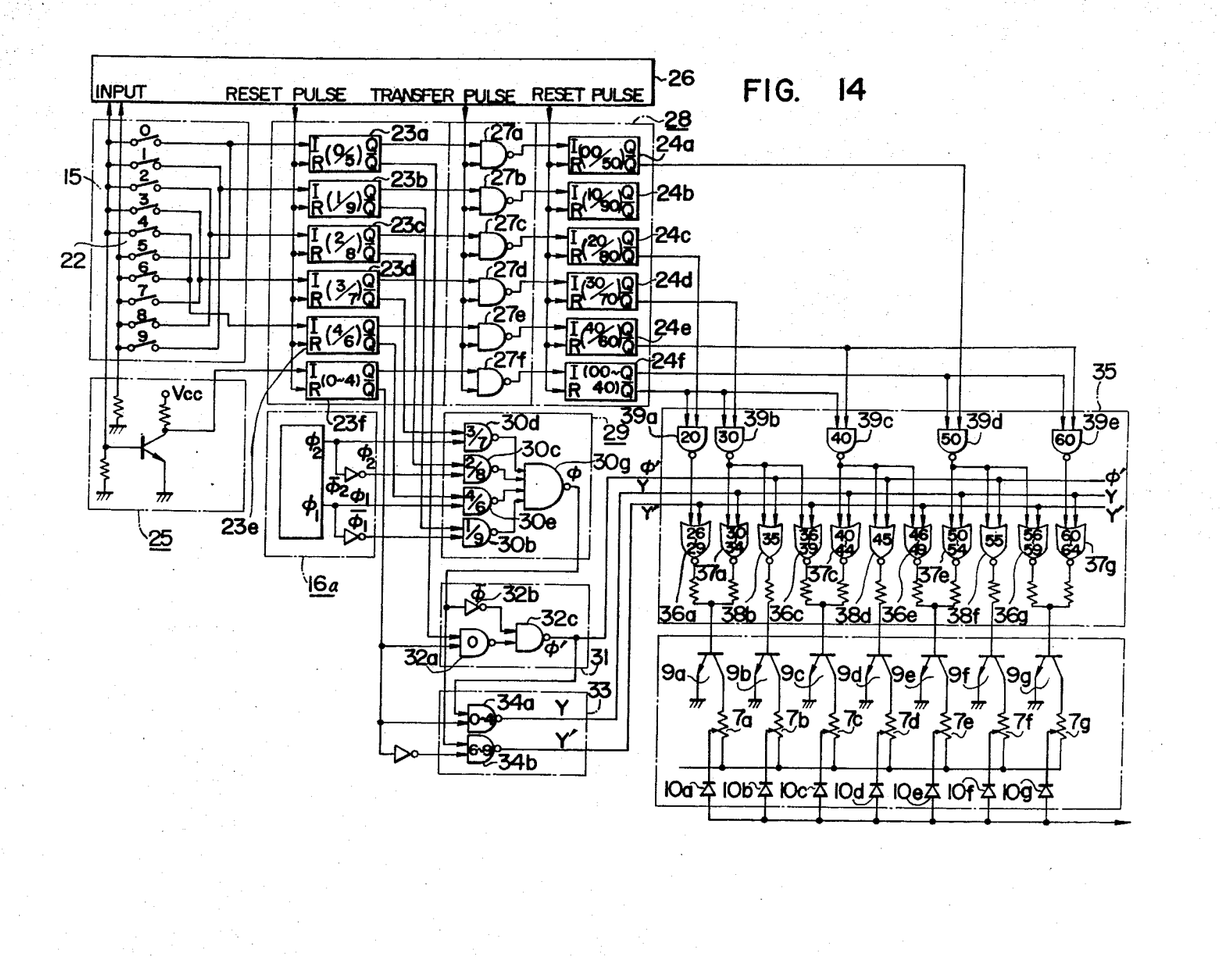
FIG. 14 is a schematic of the same system.

With reference to FIGS. 13 to 16 there will be described a second embodiment of the invention applied to an electonic tuner for a television receiver, and in which 31 different channel selection voltages for channels No. 30 to No. 60 are made available by the use of only seven different reference voltages from seven variable resistors $a$ to $g$. FIG. 13 shows a chart for the operation of this embodiment. Here, seven variable resistors 7a to 7g are provided as shown in FIG. 14, which resistors are for generating reference voltages at every 5 channels, and it is so constructed as to generate channel selection voltages for channels No. 30, No. 35, No. 40, No. 45, No. 50, No. 55 and No. 60. In FIG. 13, symbols $\phi_1, \bar{\phi}_1, \phi_2$ and $\bar{\phi}_2$ in each column represent that each of the variable resistors 7a to 7g is operated with the duty ratios of $\bar{\phi}_1, \phi_2$ and $\bar{\phi}_2$ shown in Table 4 and FIG. 6, the symbol "on" represents that it remains on or conductive, and blank portions represent that it remains non-conductive.

FIG. 14 shows a specific circuit construction for realizing the above operation. In this embodiment, a channel number is keyed in by a keyboard 15 and is memorized, and according to this memorized number the duty ratio of switching pulse signals applied to the switching transistors 9a to 9g for the respective variable resistors 7a to 7g is varied. Also, in this system the section for memorizing the keyed-in channel number and the section for varying the duty ratio of the input switching pulse signals to the switching transistors 9a to 9g for the variable resistors 7a to 7g can be made with a simple circuit construction. This embodiment will be described in detail as follows.

Figure 15:
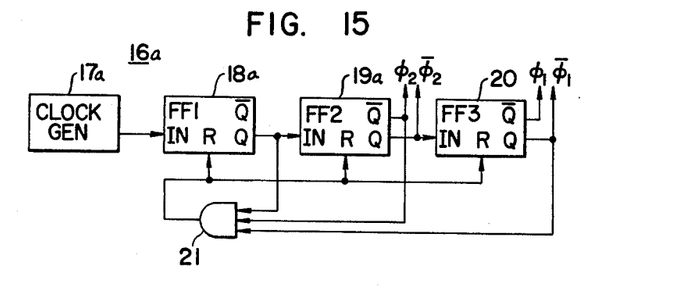
FIG. 15 is a circuit diagram showing part of the same system.

In this system, in the switching pulse signals of different duty ratios to be applied to the variable resistors 7a to 7g the signals $\bar{\phi}_1$ and $\bar{\phi}_2$ can be obtained by inverting the respective signals $\phi_1$ and $\phi_2$ as is apparent from Table 4 and FIG. 13. Thus, the pulses to be produced by a pulse generating circuit 16a may be basically either signals $\phi_1$ and $\phi_2$ or signals $\bar{\phi}_1$ and $\bar{\phi}_2$. A specific example of this circuit is shown in FIG. 15. This circuit is a counter where a clock pulse signal from a clock oscillator 17a is frequency divided to 1/5 through flip-flops 18a 19a and 20 and AND gate 21, and $\phi_2$ (and $\bar{\phi}_2$) can be obtained from the flip-flop 19a and $\phi_1$ (and $\bar{\phi}_1$) from the flip-flop 20.

The section for memorizing a keyed-in channel number will now be described. In this section, 10 key switches 22 in the keyboard 15, corresponding to the respective digits 0 to 9, are combined in five pairs of digits 0 and 5, 1 and 9, 2 and 8, 3 and 7, and 4 and 6, and for every pair, when any one of the numbers is keyed in by the keyboard 15, the numbers are memorized by the flip-flops 23a to 23e. This combination of digits in pairs is, as it is apparent from Table 4 and FIG. 13, based on the fact that the operating mode of each of the variable resistors 7a to 7g is the same irrespective of which one of paired digits 0 and 5, 1 and 9, 2 and 8, 3 and 7 or 4 and 6 is keyed in. With this arrangement, the circuit processing can be simplified. In this case, however, additional flip-flops 23f and 24f are provided for discriminating whether the keyed-in digit belongs to the group of digits 0 to 4 or the group of digits 5 to 9. More particularly, the key switches 22 in the keyboard 15 are divided into two groups, and when an input representing a digit in one of the groups, namely the group of digits 0 to 4, is keyed-in, it is detected by a detecting circuit 25 and memorized in the flip-flop, 23f indicating that a number in the group has been inputted.

Figure 16:
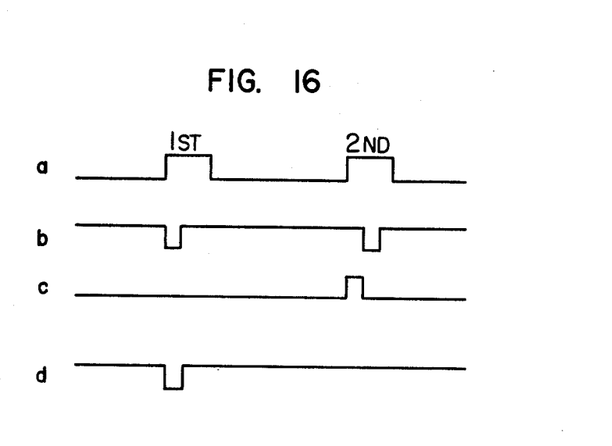
FIG. 16 is a waveform chart to illustrate the operation of the same system.

A channel number is keyed in by operating the keyboard 15 either once (in case of a one-digit channel number) or twice (in case of a two-digit channel number). Accordingly, a memory control circuit 26 is provided to control the flip-flops 23a to 23f and further flip-flops 24a to 24f. When the keyboard is operated for the first time, the control circuit delivers a reset pulse to reset the flip-flops 23a to 23f and 24a to 24f so as to register the keyed-in digit in the flip-flops 23a to 23f. When and only when the keyboard is operated once again within a predetermined interval of time (of about 2 to 3 seconds), the control circuit delivers a shift pulse to open shift gates 27a 27f so as to transfer the memorized content of flip-flops 23a to 23f to the flip-flops 24a to 24f and delivers a new reset pulse to the flip-flops 23a to 23f to register the newly keyed-in digit therein. If the second operation of the keyboard is not made within the predetermined time interval, the memoriying operation is ended by concluding that the keyed-in channel number is a one-digit channel number. FIG. 16 shows a timing chart of he memorizing operation. In the Figure, there is indicated at $a$ the timing of the operation of the keyboard 15, at $b$ the reset pulses delivered to the flip-flops 23a to 23f, at $c$ the transfer pulse delivered to the transfer gates 27a to 27f, and at d the reset pulse delivered to the flip-flops 24a to 24f. In effect, a memory unit 28 is constituted by the flip-flops 23a to 23f, which eventually memorize the unit's place digit, and the flip-flops 24a to 24f, which memorize the ten's place digit.

Now, a section for producing a required voltage from the afore-mentioned switching pulse signals $\phi_1$, $\bar{\phi}_1$, $\phi_2$ and $\bar{\phi}_2$ and the memorized channel number will be described. This section includes a pulse selecting circuit 29, a 5 discriminating circuit 31, a Y and Y generating circuit 33 and a variable resistor drive circuit 35. In the pulse selecting circuit 29, the pulse signals $\bar{\phi}_1$, $\bar{\phi}_2$, $\phi_1$ and $\phi_2$ are coupled to respective NAND gates 30b to 303, to which the memory content of the unit's place digit of the channel number from the flip-lops 23b to 23e is also coupled, whereby $\bar{\phi}_1$ is taken out as output $\phi$ when the unit's place digit of the channel number is either 1 or 9, $\bar{\phi}_2$ when the digit is either 2 or 8, $\phi_2$ when the digit is either 3 or 7, and $\phi_1$ when the digit is either 4 or 6. When the digit is either 0 or 5, the output $\phi$ remains at a high level. In the 5 discriminating circuit 31, the outputs of the flip-flops 23a and 23f are coupled to a NAND gate 32a to produce an output which is at high level when the unit's place digit is 0. This output is coupled together with a signal $\bar{\phi}$ from an inverter 32b inverting the output $\phi$ to a NAND gate 32c to obtain an output $\phi$, which is at a low lever when the unit's place digit of the channel number is 0, is at high level when the digit is 5, and is the same as the output $\phi$ in the other cases. In the pulse separation circuit 33, the output $\phi$ and the output of the flip-flop 23f are coupled to a NAND gate 34a, while the output $\phi$ and an inversion output obtained from the output of the flip-flop 23f are coupled to a NAND gate 34b whereby outputs Y and Y' are separately obtained, the former being provided when the unit's place digit of the channel number belongs to the group of digits 0 to 4 and the latter provided when the digit belongs to the group of digits 6 to 9. Thus, the output Y is at low level for digit 0, $\phi_1$ for digit 1, $\phi_2$ for digit $\phi_2$, $\bar{\phi}_2$ for digit 3 and $\bar{\phi}_2$ for digit 4, while the output Y' is $\phi_1$ for digit 6, $\bar{\phi}_2$ for digit 7, $\phi_2$ for digit 8 and $\phi_1$ for digit 9.

In the variable resistor drive circuit 35, the variable resistor to be operated is selected from the variable 7a to 7g in correspondence to the keyed-in channel number. Here, NOR gates 36a, 36c, 36e, 36g, 37a, 37c, 37e, 37g, 38b, 38d and 38f are provided. The output Y' is coupled to the NOR gates 36a, 36c, 36e and 36g, the output Y is coupled to the NOR gates 37a 37c, 37e and 37g, and the output $\phi$ is coupled to the NOR gates 38b, 38d and 38f. NAND gates 39a to 39e are also provided to detect the ten's place digit of the keyed-in channel number, and their ouptuts are coupled to the corresponding NOR gates respectively. The outputs of the NOR gates 36a and 37a are coupled in OR and are connected to a switching transistor 9a. Similarly, the outputs of the NOR gates 36c and 37c, 36e and 37e, and 36g and 37g are coupled in OR and are connected to respective switching transistors 9c, 9e and 9g.

With the above construction, the variable resistors 7a to 7g are operated in the mode as shown in FIG. 13 to obtain a required voltage.

As has been shown, in the proceding embodiment 31 different voltages for channels No. 30 to No. 60 can be obtained by means of 7 variable resistors 7a to 7g, and the structure therefor can be made simple.

In the preceding embodiment the variable resistors are provided at every five steps, however, according to the invention it is of course possible to divide them into any number of steps and to carry out the generation of the voltage. In this case, one may use adequate pulse signals with duty ratios corresponding to the division. In the preceding embodiment the key switches in the channel number input signal memorizing section are divided into two groups, one for digits 0 to 4 and the other for digits 5 to 9, and arranged into five pairs for digits 0 and 5, 1 and 9, 2 and 8, 3 and 7, and 4 and 6, however, one may memorize the number by dividing the numbers into any group and making any kind of combination, with the provision of memorizing means for memorizing which group the specified digit belongs to. For example, where there are $(n + 1)$ specific input signals from $m$ to $(m + n)$ they may be divided into two groups, one consisting of signals $m$ to $$\left(m+\left(\frac{n+1}{2}\right)\right)$$

and the other consisting of signals $$\left(m+\left(\frac{n+1}{2}\right)+1\right)$$

to $(m + n)$, and arranged in pairs $m$ and $$\left(m+\left(\frac{n+1}{2}\right)+1\right),$$

$(m + 1)$ and $(m + n - 1)$, $(m + 2)$ and $(m + n - 2)$, . . . , and means for memorizing which group the keyed input signal belongs to may be provided. In this case, the duty ratio for taking out a voltage from the reference voltage generating means such as variable resistors may be adapted to be varied at a step of $$\left(\frac{n+1}{4}\right).$$

With such arrangement, the output voltage may be readily varied in a simple manner as in the preceding embodiment.

As has been shown, the present voltage generating system is featured by providing a first memorizing means for dividing a plurality of specific input signals, such as channel number signals which are inputted from the input means such as a keyboard, into a plurality of groups, for combining these input signals into sets, the signals in each set taken out being one signal from every one of the divided groups, and for memorizing input signals for every set which is arranged as mentioned above, a second memorizing means for memorizing to which group the input signal belongs, means for generating a plurality of reference voltages, switching means for taking out any one or any plurality of the reference voltages at any duty ratio and means for taking the average value of the taken-out voltage as the output voltage; the duty ratio of the switching means is controlled by the output of both said memorizing means so as to produce an output voltage corresponding to the keyed-in input signal. Thus, it is possible to produce a great number of voltages of different values with less number of reference voltage generating means and also simplify the construction for switching the different voltages.

Figure 17:
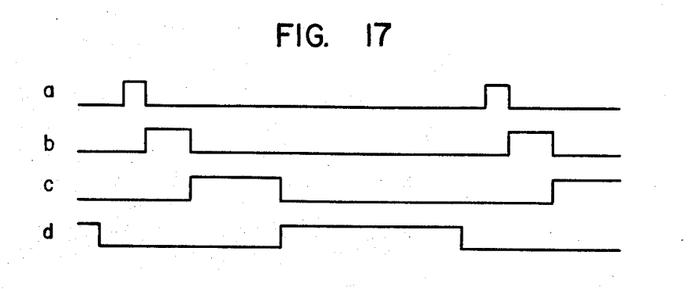
FIG. 17 is a waveform chart to illustrate the operational principles of a further embodiment of the invention applied to a digital-to-analog converter.

With reference to FIGS. 17 to 20 there will be described a further embodiment of the invention applied to a four-bit digitial-to-analog converter. The principles underlying this system will first be described with reference to FIG. 17. In this system, four different pulse signals, whose duty ratios are respectively 1/16, 2/16, 4/14 and 8/16, in which pulse periods do not overlap with one another, as shown at $a$, $b$, $c$ and $d$ in FIG. 17, are produced. Denoting the amplitude of these pulse signals $a$, $b$, $c$, and $d$ by 1, their average values obtainable by smoothing them are respectively 1/16, 2/16, 4/16 and 8/16. These pulse signals $a$, $b$, $c$ and $d$ are made to correspond to respective bits in the 4-bit input digital signal, that is, it is so made that $2^0$ selects the pulse $a$, $2^1$ the pulse $b$, $2^2$ the pulse $c$, and $2^3$ the pulse $d$. In accordance with the input digital signal one or more of these pulse signals are selected, and the total pulse output of the selected signals is averaged, whereby a 15-step analog output voltage can be taken out in accordance with a 4-bit digital input signal.

Figure 18:
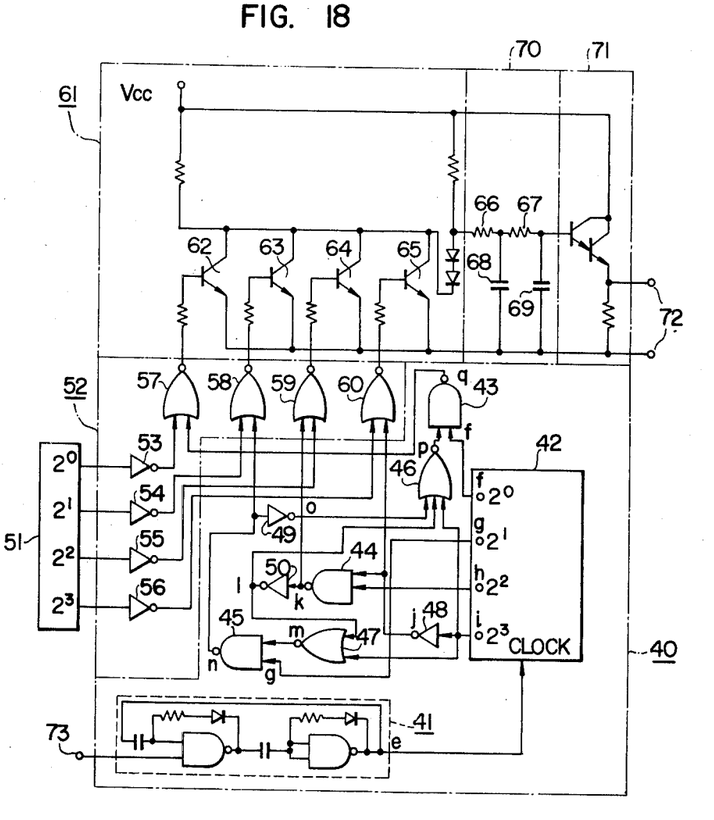
FIG. 18 is a schematic of the same digital-to-analogue converter.
Figure 19:
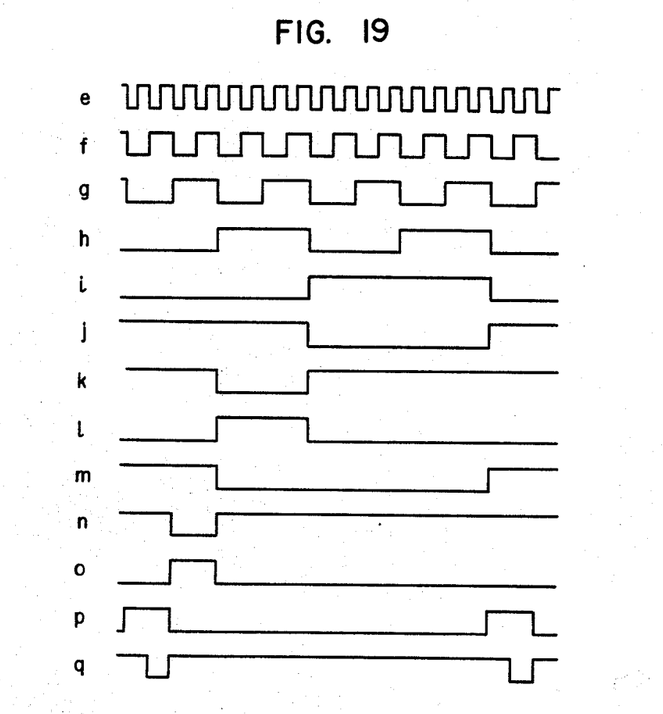
FIG. 19 is a waveform chart to illustrate the operation of the same digital-to-analog converter.

A specific circuit for executing such function will now be described with reference to FIGS. 18 to 20. In FIG. 18, designated at 40 is a pulse generating circuit for generating the aforementioned pulse signals $a$, $b$, $c$, and $d$. In this circuit, a clock pulse as shown at $e$ in FIG. 19 produced from a non-stable multi-vibrator 41 is supplied to a hexadecimal counter 42 to produce four frequency divided outputs as shown in $f$, $g$, $h$ and $i$ of FIG. 19 at their respective bit output terminals. These frequency divided output are combined through NAND gates 43, 44 and 45, NOR gates 47 and 47 and inverters 48, 49 and 50 to obtain the prescribed pulse signals $a$, $b$, $c$, and $d$ shown in FIG. 17. FIG. 19 shows waveforms appearing at various parts of the pulse generating circuit 40. It will be seen that the prescribed pulse signals are obtained in the inverted form, namely $q=\bar{a}$, $n=\bar{b}$, $k=\bar{c}$ and $j=\bar{d}$. Designated at 51 in FIG. 18 as an input specifying circuit for specifying a 4-bit digital input signal. Its $2^0$-, $2^1$-, $2^2$- and $2^3$-bit outputs are fed to a pulse selecting circuit 52. In this circuit, the individual bit signals are inverted through respective inverters 53 to 56 and then applied to respective NOR gates 57 to 60, to which the pulse outputs $q$, $n$, $k$ and $j$ from the pulse generating circuit 40 are also applied at their other input terminals. In this way, the switching pulse signals $a$, $b$, $c$, and $d$ selected in correspondence to the input digital signal are taken out from the output side of the NOR gates 57 to 60. These switching pulses $a$, $b$, $c$ and $d$ are coupled to the bases of switching transistors 62 and 65 of a switching circuit 61 for switching reference voltages according to the selected switching pulse signals. Thus, a pulse output having a duty ratio corresponding to the input digital signal is obtained at the output terminal of the switching circuit 61, and this output is smoothed through a smoothing circuit 70 consisting of resistors 66 and 67 and capacitors 68 and 69 to take an average value, which is taken out through an output circuit 71. In this way, a 16-step analog output voltage corresponding to the input digital signal can be obtained from an output terminal 72. Designated at 73 is an input terminal for coupling a control signal for on and off control of the operation.

In this way, a digital-to-analog conversion can be carried out without using a number of resistor rows. Also, since there is no need of adjusting resistances, it becomes easy to incorporate the system into a monolythic integrated circuit. Further, the step of the analog output voltage can be readily varied by varying the duty ratio of the pulse signals produced by the pulse generating circuit.

Figure 20:
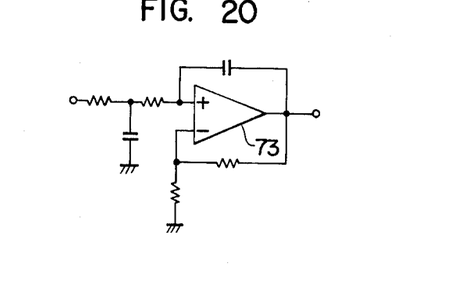
FIG. 20 is a circuit diagram showing a different example of an averaging circuit used in the same digital-to-analog converter.

In addition, the pulse generating circuit 40 and pulse selecting circuit 52 may be replaced with other suitable logic means. Also, the switching transistors 62 to 65 in the switching circuit 61 may be dispensed with by arranging such that the gates also take their role. Alternatively, it is possible to use other switching means than the transistors. Further, it is possible to use as the averaging circuit a Miller integrating circuit using an operational amplifier 73 as shown in FIG. 20.

Moreover, the number of steps of the analog output voltage may be increased by increasing the bit number of the input digital signal and the kind of the switching pulses, i.e., the kind of duty ratios. Alternatively, a plurality of source voltages for switching may be provided to increase the step number of the analog output voltage.

As has been shown, with the system of this invention the digital-to-analog conversion can be carried out without using a row of resistors, and also incorporation of the system into an integrated circuit and variation of magnitude, number of steps and step ratio of the analog output voltage can be readily accomplished.

What we claim is:

1. A voltage generating system comprising: a plurality of means for generating at lest two different reference voltages $V_A$ and $V_B$; a plurality of switching means, coupled to said reference voltage generating means, respectively, for selectively taking out the reference voltages; a switching pulse generating means for generating switching pulses and for supplying the switching pulses to said switching means, the switching pulses having certain duty ratios to cause at least one of said switching means to switch with a certain duty ratio, and the other said switching means to switch to their on state or with an inverse phase with respect to the switching phase of said at least one switching means; smoothing means for smoothing the switched reference voltages taken out from said switching means, and for outputting any of a plurality of output voltages which are obtained by dividing the reference voltages into a plurality of steps, the voltage to be outputted being determined by the duty ratios; and means for selecting which of the plurality of output voltages is to be outputted by changing the duty ratios of the switching pulses supplied to said switching means.

2. A voltage generating system according to claim 1, wherein sid plurality of reference voltage generating means include two means for producing two different reference voltages $V_A$ and $V_B$, respectively; said plurality of switching mens include at least one of two switching means provided respectively for said two different reference voltage generating means, said one switching means being switchable by a first switching pulse of a certain duty ratio, and the other switching means being switchable to be on or being switchable with an inverse phase of the switching phase of the first switching pulse, and wherein the duty ratio of the first switching pulse is selected as one of $$\frac{N-1}{N}$$

for producing correspondingly an output voltage which is one of $$V_A + \frac{1}{N}(V_B - V_A), V_A + \left[\frac{1}{N}(V_B - V_A),\right] \frac{2}{N}(V_B - V_A),$$

$$V_A + \frac{N-1}{N}(V_B - V_A).$$

3. A voltage generating system according to claim 1, wherein said plurality of reference voltage generating means include a plurality of reference voltage generating circuits individually coupled respectively with said pluraity of switching means, and producing different reference voltages, one of two said switching means for a respective reference voltage generating circuit being siwtchable by a first switching pulse of a certain duty ratio, the other said switching means being switchable to the on state or switchable with an inverse phase of the switching phase of the first switching pulse, and wherein the duty ratio of the first switching pulse is selected as one of $$\frac{N-1}{N},$$

for producing correspondingly one of a plurality of output voltages having respective levels uniformly dividing the interval between two adjacent reference voltages to (1/N).

4. A voltage generating system according to claim 1, wherein said plurality of switching pulse generating means include means for producing a clock pulse with a constant frequency, a means for frequency dividing the clock pulse, and a means for producing a plurality of switching pulses of different duty ratios by appropriately combining outputs of said frequency dividing means; and wherein said means for selecting selects a required one or more of the switching pulses for applying the selected pulse or pulses to said switching means.

5. A voltage generating system according to claim 1, wherein said means for selecting includes a channel specifying signal keying means for a channel selection system so as to produce an output voltage corresponding to an inputted channel number, the channel number output voltage being applicable as a channel selection voltage for an electronic tuner of the channel selection system for receiving the channel of the inputted channel number.

6. A voltage generating system comprising: means for producing a plurality of reference voltages; switching means coupled to said reference voltage producing means such that any one or any plurality of the reference voltages may be selectively taken out; means for smoothing the selected voltage or voltages to produce an output voltage; means for producing switching pulses for switching said switching means; and switching pulse duty ratio means including a first memory means for dividing a plurality of input signals representing corresponding channel numbers or other information into a plurality of groups, which signals are inputted from an input means combining the input signals into a plurality of sets in which in each of the sets the input signals are each selected from different groups, and for memorizing the input signals respectively for every one of the combined sets, and a second memorizing means to memorize which group the input signals belong to; and means for varying the duty ratio of the switching pulses applied to said switching means in accordance with the outputs of both said first and second memorizing means, whereby an output voltage with a value corresponding to the input signals is produced.

7. A voltage generating system according to claim 6, wherein two sets of said first and second memorizing means are provided, one of said sets memorizing means memorizing the input signal representing a ten's place digit, the other of said sets memorizing means memorizing the input signal representing a unit's place digit.

8. A voltage generting system according to claim 6, wherein the input signals are divided into two groups, one of the two groups including input signals representing respective digits 0 to 5, the other group including input signals representing respective digits 6 to 9, and are combined into 5 sets for digits 0 and 5, 1 and 9, 2 and 8, 3 and 7, and 4 and 6, said first memorizing means having 5 memories for memorizing the input signals in the five sets, each of said memories memorizing input signals in one of the sets respectively, said second memorizing means having a single memory for memorizing which group the input signals belongs to.

9. A voltage generating system comprising: means for producing one or a plurality of reference voltages; a plurality of switching means, coupled to said reference voltage generating means, for taking out any one or any plurality of the reference voltages; switching pulse generating means for generating a switching pulse which has one duty ratio of a plurality of duty ratios determined by a binary signal input to said pulse generating means, and for applying the switching pulse to said plurality of switching means to make said plurality of switching means switch; means for synthesizing all of the pulse shaped reference voltages outputted by the switching of said plurality of switching means; and smoothing means for averging the synthesized pulse shaped reference voltages to convert the binary signal input into a D-A converted analog voltage.

10. A voltage generating system according to claim 9, wherein only one voltage is used as a reference voltage, and wherein the D-A conversion is achieved only by varying the duty ratio of said switching pulse.

11. A voltage generating system according to claim 9, wherein said switching pulse generating means ncludes a frequency dividing means for dividing a clock signal to obtain a plurality of switching pulses of different duty ratios, the switching pulses being applied through respective gates to said switching means, said gates being on-off controlled by the binary signal input.

* * * * *

UNITED STATES PATENT AND TRADEMARK OFFICE
CERTIFICATE OF CORRECTION

PATENT NO. : 4,015,192
DATED : March 29, 1977
INVENTOR(S) : Koyanagi

It is certified that error appears in the above-identified patent and that said Letters Patent are hereby corrected as shown below:

Column 10, line 66, change "$\frac{N-1}{N}$" to $--\frac{1}{N}, \frac{2}{N}, \ldots,$ and $\frac{N-1}{N} --$.

Column 11, lines 5 to 11, change

"$V_A + \frac{1}{N}(V_B - V_A)$, $V_A + [\frac{1}{N}(V_B - V_A), ]\frac{2}{N}(V_B - V_A)$, $V_A + \frac{N-1}{N}(V_B - V_A)$"

to $-- V_A + \frac{1}{N}(V_B - V_A)$, $V_A + \frac{2}{N}(V_B - V_A), \ldots,$ and $V_A + \frac{N-1}{N}(V_B - V_A) --$;

line 28, change "$\frac{N-1}{N}$" to $-- \frac{1}{N}, \frac{2}{N}, \ldots,$ and $\frac{N-1}{N} --$.

line 34, change "$(\frac{1}{N})$" to $-- \frac{1}{N} --$.

Signed and Sealed this

*Thirteenth* Day of *June 1978*

[SEAL]

Attest:

RUTH C. MASON
*Attesting Officer*

DONALD W. BANNER
*Commissioner of Patents and Trademarks*